United States Patent
Braley et al.

(10) Patent No.: US 9,698,289 B2
(45) Date of Patent: Jul. 4, 2017

(54) DETACHMENT OF A SELF-SUPPORTING LAYER OF SILICON <100>

(71) Applicant: COMMISSARIAT A L'ENERGIE ATOMIQUE ET AUX ENERGIES ALTERNATIVES, Paris (FR)

(72) Inventors: Carole Braley, St Egreve (FR); Frédéric Mazen, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/412,874

(22) PCT Filed: Jul. 1, 2013

(86) PCT No.: PCT/FR2013/051544
§ 371 (c)(1),
(2) Date: Jan. 5, 2015

(87) PCT Pub. No.: WO2014/006316
PCT Pub. Date: Jan. 9, 2014

(65) Prior Publication Data
US 2015/0194550 A1    Jul. 9, 2015

(30) Foreign Application Priority Data
Jul. 3, 2012 (FR) ...................... 12 56340

(51) Int. Cl.
*H01L 31/04* (2014.01)
*H01L 21/762* (2006.01)
(Continued)

(52) U.S. Cl.
CPC ............ *H01L 31/04* (2013.01); *H01L 21/265* (2013.01); *H01L 21/324* (2013.01);
(Continued)

(58) Field of Classification Search
CPC ..... H01L 31/04; H01L 21/265; H01L 21/324; H01L 31/1892
See application file for complete search history.

(56) References Cited

U.S. PATENT DOCUMENTS

| | | | | |
|---|---|---|---|---|
| 5,714,395 A | * | 2/1998 | Bruel | ............... H01L 21/76254 257/E21.568 |
| 5,877,070 A | * | 3/1999 | Goesele | ............ H01L 21/76251 117/915 |

(Continued)

FOREIGN PATENT DOCUMENTS

| | | | | |
|---|---|---|---|---|
| CN | 104428886 A | * | 3/2015 | ....... H01L 21/76254 |
| FR | 2993095 A1 | * | 1/2014 | ....... H01L 21/76254 |

(Continued)

OTHER PUBLICATIONS

Assaf H., et al., "Transfer of Thin Silicon layers by MeV Hydrogen Implantation," Nuclear Instruments and Methods in Physics Research B, vol. 240, (2005), pp. 183-187.

(Continued)

*Primary Examiner* — Laura Menz
(74) *Attorney, Agent, or Firm* — Oliff PLC

(57) ABSTRACT

A method for detaching a self-supporting layer of silicon of crystalline orientation <100>, particularly with the aim of applications in the field of photovoltaics, wherein the method includes the steps of: a) Implanting ionic species in a substrate made of silicon having a crystalline orientation <100> so as to create an embrittlement plane in the substrate, delimiting on both sides a self-supporting layer and a negative of the substrate, and b) Applying a heat treatment to the substrate implanted at step a) with a temperature ramp greater than 30° C./s so as to detach the self-supporting layer of silicon.

14 Claims, 1 Drawing Sheet

(51) Int. Cl.
*H01L 31/18* (2006.01)
*H01L 21/265* (2006.01)
*H01L 21/324* (2006.01)

(52) U.S. Cl.
CPC .... *H01L 21/76254* (2013.01); *H01L 31/1892* (2013.01); *Y02E 10/50* (2013.01)

(56) References Cited

U.S. PATENT DOCUMENTS

| | | | | |
|---|---|---|---|---|
| 6,150,239 | A * | 11/2000 | Goesele | H01L 21/76251 117/915 |
| 6,159,824 | A * | 12/2000 | Henley | B81C 1/0038 257/E21.088 |
| 6,197,697 | B1 * | 3/2001 | Simpson | H01L 21/3043 216/62 |
| 6,429,104 | B1 | 8/2002 | Auberton-Herve | |
| 7,927,980 | B2 * | 4/2011 | Tauzin | C30B 25/04 438/480 |
| 8,247,309 | B2 * | 8/2012 | Cattet | H01L 21/187 257/E21.568 |
| 8,951,809 | B2 * | 2/2015 | Moulet | H01L 21/187 414/935 |
| 9,230,848 | B2 * | 1/2016 | David | H01L 21/76254 |
| 2007/0020895 | A1 | 1/2007 | Moriceau et al. | |
| 2010/0087047 | A1 | 4/2010 | Shimomura et al. | |
| 2012/0138238 | A1 * | 6/2012 | Tauzin | H01L 21/76254 156/711 |
| 2012/0168091 | A1 * | 7/2012 | Kell | H01L 21/67092 156/707 |
| 2015/0194550 | A1 * | 7/2015 | Braley | H01L 21/76254 438/57 |

FOREIGN PATENT DOCUMENTS

| | | | | |
|---|---|---|---|---|
| FR | WO 2014006316 A1 * | 1/2014 | | H01L 21/76254 |
| FR | 2993095 B1 * | 8/2014 | | H01L 21/76254 |
| FR | KR 20150030740 A * | 3/2015 | | H01L 21/76254 |
| FR | EP 2870627 A1 * | 5/2015 | | H01L 21/76254 |

OTHER PUBLICATIONS

Aug. 20, 2013 International Search Report issued in International Patent Application No. PCT/FR2013/051544.

* cited by examiner

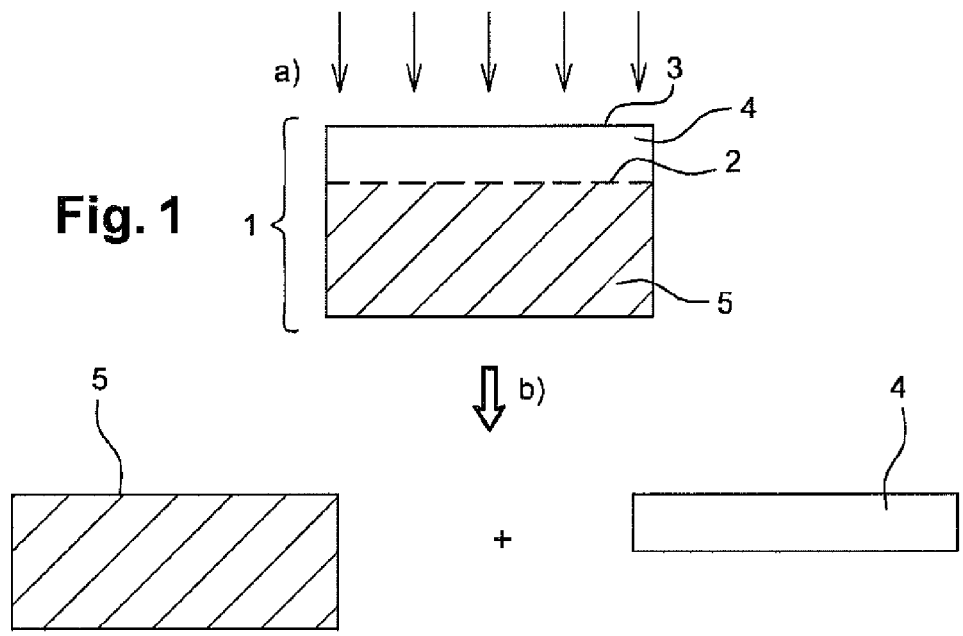
Fig. 1
Fig. 2
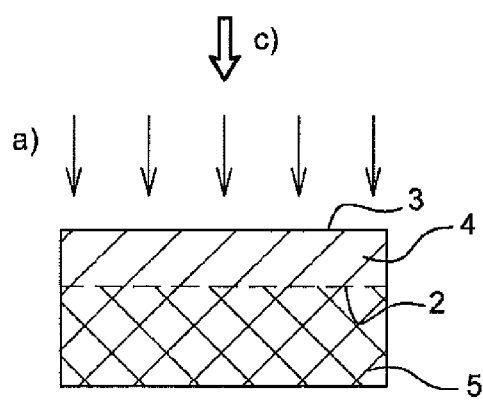
Fig. 3
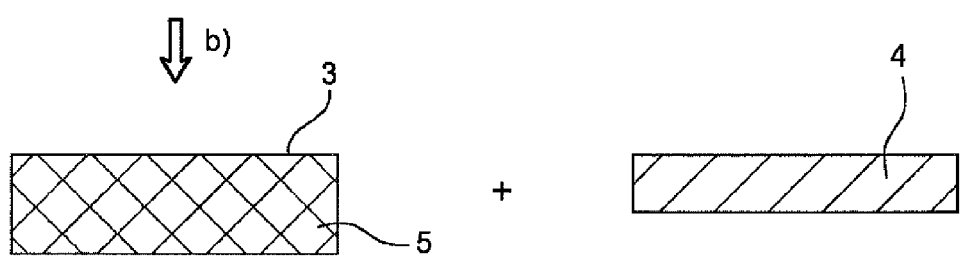
Fig. 4

DETACHMENT OF A SELF-SUPPORTING LAYER OF SILICON <100>

The present invention relates to a method for detaching a self-supporting layer of silicon of crystalline orientation <100>, in particular for applications in the field of photovoltaics.

Monocrystalline silicon of crystalline orientation <100> is particularly interesting for applications in the field of photovoltaics. This silicon is very easily textured and may advantageously lead to a surface including pyramidal conformations adapted for the manufacture of photovoltaic cells. In addition, it is also easily passivated so that the cells made from such substrates exhibit good performance.

Therefore, studies were conducted from ingots of silicon of crystalline orientation <100> in order to form self-supporting layers, namely easily manipulable and grippable layers, with a view to forming photovoltaic cells.

For example there is known a method for cutting by sawing silicon ingots, commonly used to form substrates of about 150 to 200 micrometers in thickness for photovoltaic applications. But this method results in large losses of material at the cutting plane, about 50% of the initial silicon raw material, due to the saw cut. In addition, this technique is hardly compatible when the desired thickness of the self-supporting layers varies from 10 to 100 micrometers because the thickness of the layers becomes too small to withstand the mechanical stresses of the sawing.

There is also known a technique of high-energy implantation of ionic species followed by a thermal annealing under nitrogen which leads to good results for the silicon of crystalline orientation <111>. But the silicon <111>, due to its crystalline orientation, does not texture as desired for photovoltaic applications which reduces the manufacturing yield and the efficiency of the devices thus formed.

The document of H. Hassaf et al. entitled "Transfer of thin silicon layers by MeV hydrogen implantation" published in Nucl. Instr. and Meth. in Phys. Res. B 240 (2005) 183-187 discloses that, to obtain the transfer of a layer of silicon <111>, doses between $5 \cdot 10^{16}$ and $8 \cdot 10^{16}$ H/cm2 are required for energies between 650 KeV and 2 MeV as well as a heat treatment at 600° C. for 30 minutes. Yet, such conditions do not allow to obtain a transfer for silicon <100>. It is necessary to use higher doses, of about $1 \cdot 10^{17}$ H/cm2, to obtain the detachment of a self-supporting layer of orientation <100>, which increases manufacturing costs.

This can be explained by the fact that the most favorable plane for the development of microcracks is the plane <111>. This plane is indeed the plane that contains the least inter-plane bonds in the crystalline structure of silicon. Yet, for the silicon <100>, this plane is not parallel to the surface of the substrate of orientation <100>: it is therefore not parallel anymore with the embrittlement plane obtained by implantation. The defects therefore develop preferably obliquely, along the plane <111>, when the heat treatment is applied. Thus, the fracture propagates with greater difficulty along the plane embrittled by implantation.

One of the aims of the invention is to overcome at least one of these drawbacks. To this end, the object of the invention is a method for detaching a self-supporting layer of silicon of crystalline orientation <100>, particularly with the aim of applications in the photovoltaic field, the method comprising the steps consisting of:

a—Implanting ionic species through a silicon substrate of crystalline orientation <100> so as to create an embrittlement plane delimiting on both sides a self-supporting layer and a negative of the substrate, and b—Applying a heat treatment to the implanted substrate with a temperature ramp greater than 30° C./s so as to detach the self-supporting layer of silicon.

In the present application, by the expression 'self-supporting layer' (or 'free-standing' according to the English terminology), it is understood a silicon layer which exhibits a sufficient thickness, given the mechanical properties of silicon, so that the layer is sufficiently rigid, in itself, to be grippable, manipulable and usable in later steps, particularly in the manufacture of photovoltaic devices, without requiring the assembling of the layer with a stiffening substrate. These may be typically silicon layers of thickness greater than 10 or even 20 micrometers.

It is also understood that the implantation of the ionic species was carried out through a surface of the substrate and that the self-supporting layer is delimited between the embrittlement plane and said surface of the substrate through which the implantation was carried out.

In the present application, by the expression 'embrittlement plane' it is meant a plane parallel to the surface of the implanted substrate in which is located the maximum concentration of implanted ionic species and which concentrates the plane of development of crystalline defects at the origin of the detachment of the self-supporting layer.

In the present application, the term 'negative' designates the residue of the silicon substrate <100> recovered after the detachment of the self-supporting layer of silicon and which forms a self-supporting substrate. The negative exhibits indeed the thickness required to be able to be manipulated.

Thus, thanks to this detachment method comprising a rapid temperature ramp, it is possible to easily and quickly detach a self-supporting layer of silicon of crystalline orientation <100>. The hypothesis that can be put forward to explain this detachment is the following: the rapid temperature ramp leads to a very rapid rise in pressure in the cavities formed by the implanted species. Thanks to this phenomenon, the development of defects along a horizontal plane, usually competing with the development of oblique defects, is the major phenomenon.

Advantageously, the implantation is carried out uniformly across the entire surface of the silicon substrate of crystalline orientation <100> so that the implanted dose is substantially similar at every point of the embrittlement plane.

Preferably, the temperature ramp is comprised between 50° C./s and 100° C./s, which allows to effectively detach a self-supporting layer of silicon <100> exhibiting a low surface roughness, for example a roughness in the order of 90 nm RMS. All roughness described in this document are determined by Atomic Force Microscopy AFM on fields of 20×20 micrometers.

According to one disposition, the heat treatment is applied simultaneously on the entire implanted substrate, in particular by irradiation, conduction or convection so as to facilitate the implementation of the heat treatment.

According to one possibility, the heat treatment is carried out by means of halogen lamps in a Rapid Thermal Annealing furnace RTA.

According to one alternative, the application of the heat treatment comprises a step consisting of levitating the implanted substrate between two heating members, the application of the heat treatment being typically carried out in a Levitor furnace.

According to another alternative, the heat treatment is applied in a flash furnace which allows applying a high heating power and reaching very rapid ramps of heat treatment.

Advantageously, the heat treatment is applied up to a temperature comprised between 550° C. and 800° C. so as to obtain an optimized detachment.

According to a particular embodiment, the temperature ramp is constant for the duration of the temperature rise.

According to another particular embodiment, the temperature ramp varies for the duration of the temperature rise.

According to one disposition, the step b) of the method comprises the steps consisting of b1) applying the temperature ramp until a predetermined maximum temperature is reached, and b2) maintaining the implanted substrate at the maximum temperature for a predetermined duration, for example comprised between 5 seconds and 10 minutes, so as to detach the self-supporting layer of silicon.

Preferably, the implanted ionic species are obtained from hydrogen, the hydrogen leading to the formation of light ionic species, limiting the implantation energy required to reach the depth of the desired embrittlement plane and the obtaining of a self-supporting layer.

Advantageously, the dose of implanted ionic species is less than or equal to $1 \cdot 10^{17}$ atoms/cm$^2$, preferably less than or equal to $8 \cdot 10^{16}$ atoms/cm$^2$, and more preferably a dose less than or equal to $7 \cdot 10^{16}$ atoms/cm$^2$, so that the dose of implanted ionic species is reduced by 30% compared to a detachment technique using a temperature ramp of less than 30° C./s and a dose of $10^{17}$ atoms/cm$^2$. Thanks to this method allowing the development of defects along a horizontal plane, usually competing with the development of oblique defects, it is not required to use such high implantation doses as in the prior art. The duration of the implantation being proportional to the dose of implanted ionic species, the time is reduced according to the same proportion. The overall cost of the detachment of the self-supporting layer is thus decreased.

Preferably, the step of implantation is carried out with such an energy that the thickness of the detached layer is comprised between 10 and 100 micrometers and preferably between 15 and 50 micrometers, so as to exhibit the adapted and adjusted thickness for the future steps, to reduce losses of material and optimize the economic yield of the method.

According to one particular disposition, the step of implantation of the ionic species is carried out with an energy greater than 1 MeV, for example comprised between 1 MeV and 3 MeV, so as to obtain thicknesses of silicon layers sufficient to be self-supporting.

Advantageously, the step of implantation is carried out in a silicon substrate of crystalline orientation <100> exhibiting a thickness greater than or equal to 700 micrometers and preferably a thickness comprised between 1 and 50 millimeters so as to be able to reuse the silicon substrate several times and form several self-supporting layers.

Preferably, the method comprises a step c) carried out after the step b) consisting of repeating the steps a) and b) in a negative of the silicon substrate of crystalline orientation <100> obtained in the step b) previously carried out, so as to detach a new self-supporting layer of silicon of crystalline orientation <100>.

The repetition of steps a) and b) on the negative allows recycling the initial substrate and reducing costs of the method because from a single substrate, several self-supporting layers of reproducible qualities can be obtained, while limiting losses of material.

Advantageously, the step c) is repeated until the negative of the silicon substrate of crystalline orientation <100> exhibits a thickness less than or equal to that of a self-supporting layer of silicon <100> so as to optimize to the maximum yield obtained from the initial substrate.

Preferably, step c) is repeated directly on the negative of the silicon substrate of crystalline orientation <100> so as to limit the costs of the method by avoiding the steps of surface preparation.

According to one alternative, the negative of the substrate is polished in order to reduce the surface roughness (for example until a value lower than 20 nm RMS AFM) before implementing the step c) of the method, so as to limit the irregularities of planarity in the embrittlement plane.

Other aspects, aims and advantages of the present invention will become more apparent on reading the following description of an embodiment thereof, given by way of non-limiting example and made with reference to the accompanying drawings. The figures do not necessarily respect the scale for all the elements shown so as to improve their readability. Dotted lines symbolize an embrittlement plane.

FIG. 1 schematically illustrates a step of implantation a) of ionic species through a main surface of a silicon substrate exhibiting a crystalline orientation <100> according to one embodiment of the method according to the invention.

FIG. 2 schematically illustrates a step of rapid heat treatment b) applied to the implanted silicon substrate <100> and leading to the detachment of a self-supporting layer of silicon according to an embodiment of the invention.

FIGS. 3 and 4 schematically illustrate a step c) consisting of reproducing the step a) of implantation of ionic species through a main surface of a negative of the silicon substrate <100> and the step b) of rapid heat treatment allowing the detachment of a new self-supporting layer of silicon from the negative, according to one possible embodiment of the invention.

FIG. 1 illustrates a substrate 1 of silicon of crystalline orientation <100> in which are implanted, homogeneously in the entire substrate 1, the hydrogen-based ionic species with an energy of about 1.5 MeV and a dose of about $7 \cdot 10^{16}$ H/cm$^2$. An embrittlement plane 2 shown by the dotted lines is thus formed in the substrate 1 at a depth of about 30 micrometers. The embrittlement plane 2 is parallel to the surface 3 of the substrate 1 which has been subject to the implantation and delimits on both sides a silicon layer 4, between the surface 3 and the embrittlement plane 2, which will be self-supporting and a negative 5 of the initial donor substrate 1 <100>.

According to a non-illustrated alternative, a deposited layer of oxide or of thermal oxide is formed over a thickness of about 20 nm on the surface 3 of the substrate 1 prior to step a) in order to limit the possible contamination of the material by the step of implantation. This protective layer being very thin, has little impact on the depth of the implantation.

FIG. 2 illustrates the step of application of a heat treatment performed in a rapid annealing RTA furnace with a temperature ramp of 43° C./s until reaching a temperature of 700° C. This heat treatment applied simultaneously across the entire surface 3 leads to the development of cavities along a plane parallel to the surface 3. The heat treatment can be applied on a substrate 1 exhibiting an ambient temperature or a heated substrate 1 due to the previous implantation step. The detachment of a self-supporting layer 4 of silicon of crystalline orientation <100> with a thickness of about 30 micrometers is thus obtained and forms a negative 5 of the initial donor substrate 1. The roughness of the surfaces of the self-supporting layer 4 and of the negative 5 originating from the fracture is about 90 nm RMS.

According to a non-illustrated possibility, the possible layer of oxide SiO2 formed beforehand is etched before proceeding to other steps with the aim of the formation of devices on the self-supporting layer 4.

FIG. 3 illustrates a first part of step c) consisting of repeating the step a) of implantation of the hydrogen-based ionic species with a dose of about $7 \cdot 10^{16}$ H/cm$^2$ and an energy of about 2 MeV through the surface 3 of the negative 5 obtained in the previous step b). An embrittlement plane 2 parallel to the implanted surface 3 is obtained in the negative 5 at a depth of about 50 micrometers delimiting a new layer 4 of silicon and a new negative 5 of the initial donor substrate 1.

According to a non-illustrated alternative, the surface 3 of the negative 5 may undergo a polishing step, for example a chemical mechanical polishing (CMP) and/or a step of cleaning of the surface 3 prior to the implantation step so as to smooth the surface 3. A polishing step can also be carried out on the surface of the self-supporting layer 4 according to the desired use. The surface 3 of the negative 5 can also be covered with a thin oxide layer as previously described.

FIG. 4 illustrates the second and last part of step c) consisting of repeating the step b) of application of a heat treatment performed in a rapid annealing RTA furnace with a temperature ramp of 60° C./s until reaching a temperature of 800° C. The application of this rapid heat treatment and simultaneously across the entire surface 3 leads to the development of cavities along a plane parallel to the surface 3. The detachment of a new self-supporting layer 4 of silicon of crystalline orientation <100> with a thickness of about 50 micrometers is thus obtained. The roughness of the surfaces of the self-supporting layer 4 and of the new negative 5 originating from the fracture is about 130 nm RMS.

According to a non-illustrated alternative, the step c) is applied with conditions of implantation and heat treatment similar to those used in the first steps a) and b) illustrated in FIGS. 1 and 2.

According to another non illustrated alternative embodiment, the step c) is repeated on the negative 5 of the initial donor substrate 1 as many times as the negative 5 allows it, that is to say until the negative 5 is no longer self-supporting.

Thus, the method of the invention allows preparing, in a reproducible manner, from a silicon substrate 1 of crystalline orientation <100>, self-supporting layers 4 of silicon <100> with doses reduced by 30%, implantation durations also reduced by 30% and an accelerated heat treatment. In this way, the cycle time is reduced leading to reduction of the costs of implementation. In addition, the method can be repeated several times on the same substrate 1, which reduces as well manufacturing costs of the self-supporting layer 4 of Si <100>, particularly of interest for photovoltaic applications.

It goes without saying that the invention is not limited to the embodiment described above by way of example, but that it comprises all technical equivalents and alternatives of the described means as well as their combinations.

The invention claimed is:

1. A method for detaching a self-supporting layer of silicon of crystalline orientation <100>, wherein the method comprises:
   a) implanting ionic species across an entire surface of a substrate made of silicon having a crystalline orientation <100> with a dose of less than or equal to $8 \times 10^{16}$ atoms/cm$^2$ so as to create an embrittlement plane in the substrate, delimiting on both sides a self-supporting layer and a negative of the substrate; and
   b) applying a heat treatment up to a temperature of from 550° C. to 800° C. to the substrate implanted at step a) with a temperature ramp greater than 30° C./s so as to detach the self-supporting layer of silicon crystalline orientation <100>, wherein the self-supporting layer of silicon crystalline orientation <100> has a thickness greater than 10 micrometers and wherein a roughness of a surface of the negative of the substrate detached from the substrate and a roughness of a surface of the self-supporting layer detached from the substrate is low.

2. The method according to claim 1, wherein the temperature ramp is comprised between 50° C./s and 100° C./s.

3. The method according to claim 1, wherein the heat treatment is applied simultaneously on the entire substrate implanted at step a).

4. The method according to claim 1, wherein the heat treatment is applied simultaneously on the entire substrate implanted at step a) by one of radiation.

5. The method according to claim 1, wherein the heat treatment is applied simultaneously on the entire substrate implanted at step a) by one of conduction.

6. The method according to claim 1, wherein the heat treatment is applied simultaneously on the entire substrate implanted at step a) by one of convection.

7. The method according to claim 1, wherein the implanted ionic species are obtained from hydrogen.

8. The method according to claim 1, wherein the dose of implanted ionic species is less than or equal to $7 \cdot 10^{16}$ atoms/cm$^2$.

9. The method according to claim 1, wherein the implanting step a) is carried out with such an energy that the thickness of the detached self-supporting layer is comprised between 10 and 100 micrometers.

10. The method according to claim 1, wherein the implanting step a) is carried out with such an energy that the thickness of the detached self-supporting layer is comprised between 15 and 50 micrometers.

11. The method according to claim 1, wherein the implanting step a) of the ionic species is carried out with an energy greater than 1 MeV.

12. The method according to claim 1, wherein the implanting step a) is carried out in a silicon substrate of crystalline orientation <100>exhibiting a thickness greater than or equal to 700 micrometers.

13. The method according to claim 1, wherein the implanting step a) is carried out in a silicon substrate of crystalline orientation <100>exhibiting a thickness comprised between 1 and 50 millimeters.

14. The method according to claim 1, wherein the method comprises a step c) carried out after step b) consisting of repeating the steps a) and b) in the negative of the substrate made of silicon having a crystalline orientation <100>obtained in the previously carried out step b), so as to detach a new self-supporting layer of silicon.

* * * * *